(12) United States Patent
Guzek et al.

(10) Patent No.: US 9,780,054 B2
(45) Date of Patent: Oct. 3, 2017

(54) SEMICONDUCTOR PACKAGE WITH EMBEDDED DIE AND ITS METHODS OF FABRICATION

(71) Applicant: INTEL CORPORATION, Santa Clara, CA (US)

(72) Inventors: John S. Guzek, Chandler, AZ (US); Javier Soto Gonzalez, Chandler, AZ (US); Nicholas R. Watts, Phoenix, AZ (US); Ravi K Nalla, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/529,881

(22) Filed: Oct. 31, 2014

(65) Prior Publication Data

US 2015/0050781 A1    Feb. 19, 2015

Related U.S. Application Data

(62) Division of application No. 12/655,335, filed on Dec. 29, 2009, now Pat. No. 8,901,724.

(51) Int. Cl.
 *H01L 21/00* (2006.01)
 *H01L 23/00* (2006.01)
 (Continued)

(52) U.S. Cl.
 CPC ............. *H01L 24/11* (2013.01); *H01L 21/56* (2013.01); *H01L 21/568* (2013.01);
 (Continued)

(58) Field of Classification Search
 CPC . H01L 2224/48227; H01L 2224/73265; H01L 2224/32225; H01L 2224/32145;
 (Continued)

(56) References Cited

U.S. PATENT DOCUMENTS 3,691,628 A * 9/1972 Kim ..................... H01L 24/24
                                                      257/687
5,306,670 A * 4/1994 Mowatt ............... H01L 23/5383
                                                      257/E23.172

(Continued)

FOREIGN PATENT DOCUMENTS

CN    1498417 A    5/2004
WO    02/25825 A2  3/2002
 (Continued)

OTHER PUBLICATIONS

Circuit Package, May 1968, IBM Technical Disclosure Bulletin No. NN68051977, vol. 10, Issue No. 12, pp. 1977-1978.*

(Continued)

*Primary Examiner* — Teresa M Arroyo
(74) *Attorney, Agent, or Firm* — Winkle, PLLC

(57) ABSTRACT

Embodiments of the present invention describe a semiconductor package having an embedded die. The semiconductor package comprises a coreless substrate that contains the embedded die. The semiconductor package provides die stacking or package stacking capabilities. Furthermore, embodiments of the present invention describe a method of fabricating the semiconductor package that minimizes assembly costs.

13 Claims, 14 Drawing Sheets

(51) Int. Cl.
*H01L 21/56* (2006.01)
*H01L 21/683* (2006.01)
*H01L 23/498* (2006.01)
*H01L 23/538* (2006.01)
*H01L 25/03* (2006.01)
*H01L 25/10* (2006.01)
*H05K 1/18* (2006.01)
*H01L 21/768* (2006.01)
*H01L 25/07* (2006.01)
*H01L 23/31* (2006.01)
*H01L 25/11* (2006.01)
*H05K 3/46* (2006.01)

(52) U.S. Cl.
CPC ........ *H01L 21/6835* (2013.01); *H01L 21/768* (2013.01); *H01L 23/49816* (2013.01); *H01L 23/5389* (2013.01); *H01L 24/19* (2013.01); *H01L 24/27* (2013.01); *H01L 24/83* (2013.01); *H01L 25/03* (2013.01); *H01L 25/105* (2013.01); *H05K 1/185* (2013.01); *H01L 23/315* (2013.01); *H01L 23/49822* (2013.01); *H01L 23/49827* (2013.01); *H01L 24/26* (2013.01); *H01L 24/48* (2013.01); *H01L 24/73* (2013.01); *H01L 25/074* (2013.01); *H01L 25/117* (2013.01); *H01L 2221/68345* (2013.01); *H01L 2224/03462* (2013.01); *H01L 2224/0401* (2013.01); *H01L 2224/11831* (2013.01); *H01L 2224/12105* (2013.01); *H01L 2224/131* (2013.01); *H01L 2224/13025* (2013.01); *H01L 2224/16225* (2013.01); *H01L 2224/16227* (2013.01); *H01L 2224/24145* (2013.01); *H01L 2224/24227* (2013.01); *H01L 2224/26* (2013.01); *H01L 2224/2732* (2013.01); *H01L 2224/27312* (2013.01); *H01L 2224/32145* (2013.01); *H01L 2224/32225* (2013.01); *H01L 2224/451* (2013.01); *H01L 2224/48091* (2013.01); *H01L 2224/48227* (2013.01); *H01L 2224/73265* (2013.01); *H01L 2224/73267* (2013.01); *H01L 2224/821* (2013.01); *H01L 2224/83192* (2013.01); *H01L 2224/83874* (2013.01); *H01L 2224/92132* (2013.01); *H01L 2225/1035* (2013.01); *H01L 2225/1058* (2013.01); *H01L 2924/00014* (2013.01); *H01L 2924/014* (2013.01); *H01L 2924/01029* (2013.01); *H01L 2924/01033* (2013.01); *H01L 2924/01046* (2013.01); *H01L 2924/01078* (2013.01); *H01L 2924/01079* (2013.01); *H01L 2924/12042* (2013.01); *H01L 2924/14* (2013.01); *H01L 2924/1517* (2013.01); *H01L 2924/15153* (2013.01); *H01L 2924/15311* (2013.01); *H01L 2924/181* (2013.01); *H01L 2924/18162* (2013.01); *H01L 2924/3511* (2013.01); *H01L 2924/40252* (2013.01); *H01L 2924/40407* (2013.01); *H01L 2924/40501* (2013.01); *H05K 3/4682* (2013.01); *H05K 2201/10477* (2013.01); *H05K 2203/0152* (2013.01)

(58) Field of Classification Search
CPC ......... H01L 2224/131; H01L 2224/451; H01L 2224/48091; H01L 2224/83192; H01L 2224/45099; H01L 2224/03462; H01L 2224/0401; H01L 2224/11831; H01L 2224/12105; H01L 2224/13025; H01L 2224/16225; H01L 2224/16227; H01L 2224/27312; H01L 2224/2732; H01L 2224/73267; H01L 2224/83874; H01L 2924/00; H01L 2924/00014; H01L 2924/00012; H01L 2924/014; H01L 2924/12042; H01L 2924/15153; H01L 2924/1517; H01L 2924/15311; H01L 2924/181; H01L 2924/01029; H01L 2924/01033; H01L 2924/01046; H01L 2924/01078; H01L 2924/01079; H01L 2924/14; H01L 2924/3511; H01L 2924/40252; H01L 2924/40407; H01L 2924/40501; H01L 21/56; H01L 21/568; H01L 21/6835; H01L 21/768; H01L 2221/68345; H01L 2225/1035; H01L 2225/1058; H01L 23/49816; H01L 23/49822; H01L 23/49827; H01L 23/5389; H01L 24/11; H01L 24/19; H01L 24/27; H01L 24/48; H01L 24/83; H01L 25/03; H01L 25/105; H01L 24/73; H01L 2224/821; H01L 2224/92312; H01L 2224/26; H01L 2224/24227; H01L 2224/24145; H01L 2924/18162; H01L 25/074; H01L 25/117; H01L 24/26; H01L 23/315; B23K 37/00; B65B 67/10; B65B 41/12; G01G 19/52; G01G 23/3728; H05K 1/185; H05K 2201/10477; H05K 2203/0152; H05K 3/4682
USPC ........................................ 438/118
See application file for complete search history.

(56) References Cited

U.S. PATENT DOCUMENTS

| | | | |
|---|---|---|---|
| 5,324,687 A * | 6/1994 | Wojnarowski | H01L 21/6835 156/154 |
| 5,353,498 A | 10/1994 | Fillion et al. | |
| 5,497,033 A | 3/1996 | Fillion et al. | |
| 5,527,741 A | 6/1996 | Cole et al. | |
| 5,841,193 A | 11/1998 | Eichelberger | |
| 5,963,429 A | 10/1999 | Chen | |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,306,686 B1 | 10/2001 | Horton et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,872,589 B2 | 3/2005 | Strandberg et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |

(56) References Cited

U.S. PATENT DOCUMENTS

| | | | |
|---|---|---|---|
| 7,067,356 B2 | 6/2006 | Towle et al. | |
| 7,071,024 B2 | 7/2006 | Towle et al. | |
| 7,078,788 B2 | 7/2006 | Vu et al. | |
| 7,098,070 B2 | 8/2006 | Chen et al. | |
| 7,109,055 B2 | 9/2006 | McDonald et al. | |
| 7,112,467 B2 | 9/2006 | Eichelberger et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,242,092 B2 * | 7/2007 | Hsu | H01L 23/36 257/678 |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,449,363 B2 | 11/2008 | Hsu | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 7,723,164 B2 | 5/2010 | Lu et al. | |
| 7,842,887 B2 * | 11/2010 | Sakamoto | H01L 21/4846 174/260 |
| 8,264,849 B2 | 9/2012 | Guzek | |
| 8,304,913 B2 | 11/2012 | Nalla et al. | |
| 8,313,958 B2 | 11/2012 | Swaminathan et al. | |
| 2004/0155337 A1 | 8/2004 | Strandberg et al. | |
| 2005/0098891 A1 * | 5/2005 | Wakabayashi | H01L 21/568 257/758 |
| 2005/0161799 A1 * | 7/2005 | Jobetto | H01L 23/5389 257/690 |
| 2005/0161833 A1 | 7/2005 | Takeuchi et al. | |
| 2006/0065972 A1 | 3/2006 | Khan et al. | |
| 2006/0115931 A1 | 6/2006 | Hsu | |
| 2006/0186531 A1 | 8/2006 | Hsu | |
| 2007/0235882 A1 | 10/2007 | Sekiguchi et al. | |
| 2007/0252287 A1 | 11/2007 | Pogge et al. | |
| 2008/0023819 A1 | 1/2008 | Chia et al. | |
| 2008/0054448 A1 | 3/2008 | Lu et al. | |
| 2008/0116569 A1 | 5/2008 | Huang et al. | |
| 2008/0315377 A1 | 12/2008 | Eichelberger et al. | |
| 2008/0315391 A1 | 12/2008 | Kohl et al. | |
| 2009/0007282 A1 | 1/2009 | Tomizuka et al. | |
| 2009/0072382 A1 | 3/2009 | Guzek | |
| 2009/0079063 A1 | 3/2009 | Chrysler et al. | |
| 2009/0079064 A1 | 3/2009 | Tang et al. | |
| 2009/0212416 A1 | 8/2009 | Skeete | |
| 2009/0294942 A1 | 12/2009 | Palmer et al. | |
| 2009/0309202 A1 | 12/2009 | Hsu et al. | |
| 2010/0044855 A1 | 2/2010 | Eichelberger et al. | |
| 2010/0047970 A1 | 2/2010 | Eichelberger et al. | |
| 2011/0101491 A1 | 5/2011 | Skeete et al. | |
| 2011/0108999 A1 | 5/2011 | Nalla et al. | |
| 2011/0156231 A1 | 6/2011 | Guzek | |
| 2011/0228464 A1 | 9/2011 | Guzek et al. | |
| 2011/0241186 A1 | 10/2011 | Nalla et al. | |
| 2011/0241195 A1 | 10/2011 | Nalla et al. | |
| 2011/0241215 A1 | 10/2011 | Sankman et al. | |
| 2011/0254124 A1 | 10/2011 | Nalla et al. | |
| 2011/0316140 A1 | 12/2011 | Nalla et al. | |
| 2012/0001339 A1 | 1/2012 | Malatkar | |
| 2012/0009738 A1 | 1/2012 | Crawford et al. | |
| 2012/0074581 A1 | 3/2012 | Guzek et al. | |
| 2012/0112336 A1 | 5/2012 | Guzek et al. | |
| 2012/0129298 A1 * | 5/2012 | Lin | H01L 25/16 438/118 |
| 2012/0139095 A1 | 6/2012 | Manusharow et al. | |
| 2012/0139116 A1 | 6/2012 | Manusharow et al. | |

FOREIGN PATENT DOCUMENTS

| | | |
|---|---|---|
| WO | 2011/090570 A2 | 7/2011 |
| WO | 2011/090570 A3 | 10/2011 |

OTHER PUBLICATIONS

Office Action received for Taiwan Patent Application No. 099142999, mailed on Jul. 28, 2015, 11 pages of Taiwan Office Action and 1 page of English Search Report.

Office Action received for Chinese Patent Application No. 201080054650.4, mailed on Apr. 23, 2014, 17 pages of English Translation and 10 Pages of Chinese Office Action.

Office Action received for Chinese Patent Application No. 201080054650.4, mailed on Oct. 20, 2014, 11 pages of English Translation and 8 Pages of Chinese Office Action.

Notice of Allowance received for Korean Patent Application No. 2012-7016887, mailed on Sep. 25, 2014, 1 page of English Translation and 2 pages of Korean NOA.

Office Action received for Korean Patent Application No. 2012-7016887, mailed on Feb. 3, 2014, 1 page of English Translation and 1 page of Office Action.

Office Action received for Korean Patent Application No. 2012-7016887, mailed on Jun. 17, 2014, 3 pages of English Translation only.

International Preliminary Report on Patentability and Written Opinion received for PCT Patent Application No. PCT/US2010/059237, mailed on Jul. 12, 2012, 5 pages.

International Search Report and Written Opinion received for PCT Patent Application No. PCT/US2010/059237, mailed on Aug. 19, 2011, 7 pages.

Ma, et al., "Direct Build-Up Layer on an Encapsulated Die Package", U.S. Appl. No. 09/640,961, filed Aug. 16, 2000, 70 pages.

Office Action received for Chinese Patent Application No. 201080054650.4, mailed on Apr. 13, 2015, 10 pages of English Translation of Chinese Office Action and 7 pages of Chinese Office Action.

* cited by examiner

SEMICONDUCTOR PACKAGE WITH EMBEDDED DIE AND ITS METHODS OF FABRICATION

RELATED APPLICATION

The present application is a divisional of U.S. patent application Ser. No. 12/655,335, filed on Dec. 29, 2009, now U.S. Pat. No. 8,901,724, entitled "SEMICONDUCTOR PACKAGE WITH EMBEDDED DIE AND ITS METHODS OF FABRICATION" which is hereby incorporated herein by reference in its entirety and for all purposes.

BACKGROUND

1. Field

The present invention relates to the field of semiconductor packaging and more particularly to an embedded die in a semiconductor package and its method of fabrication.

2. Discussion of Related Art

Semiconductor packages are used for protecting an integrated circuit (IC) chip or die, and also to provide the die with an electrical interface to external circuitry. With the increasing demand for smaller electronic devices, semiconductor packages are designed to be even more compact and must support larger layout density. For example, some semiconductor packages now use a coreless substrate, which does not include the thick resin core layer commonly found in conventional substrates. Furthermore, the demand for higher performance devices results in a need for an improved semiconductor package that enables mixed technology die stacking or provide package stacking capability while maintaining a thin packaging profile.

DETAILED DESCRIPTION

A semiconductor package having an embedded die and its method of fabrication are described. In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a semiconductor package having an embedded die. In one embodiment, the semiconductor package comprises a coreless substrate that contains the embedded die. By embedding the die in the coreless substrate, the assembly steps commonly used in conventional flip-chip assembly are eliminated, thus reducing assembly costs. Furthermore, the semiconductor package enables mixed-technology die stacking or package stacking Hence, the semiconductor package provides the advantages of thin-profile packaging with die-stacking or package-stacking capabilities at reduced package assembly costs.

Figure 1:
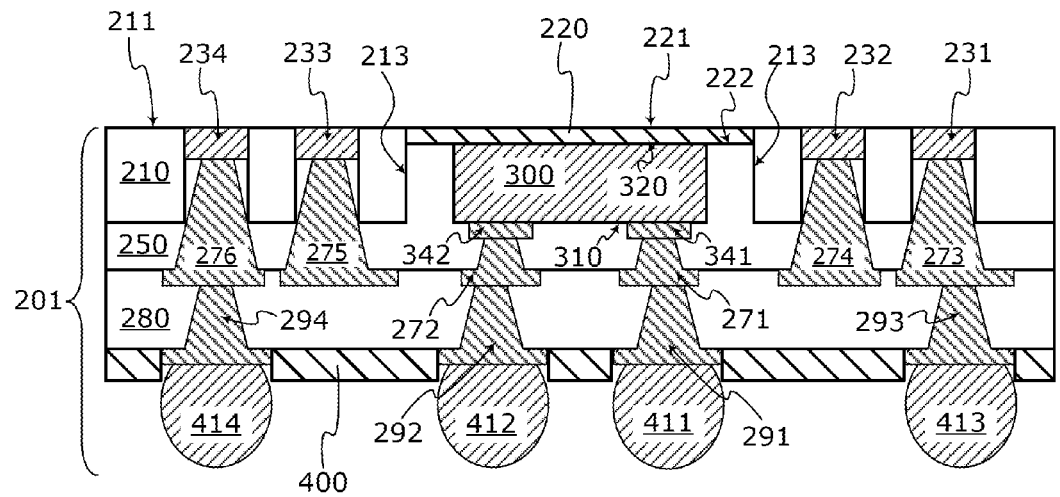
FIG. 1 is cross-sectional view that illustrates a semiconductor package in accordance with one embodiment of the present invention.

FIG. 1 illustrates a cross-sectional view of a semiconductor package 201 in accordance with one embodiment of the present invention. The semiconductor package 201 comprises a first dielectric layer 210 having a die cavity 213. In one embodiment, the die cavity 213 is centrally located and extends through the first dielectric layer 210. A layer of adhesive 220 is formed in the die cavity 213. In an embodiment of the present invention, the layer of adhesive 220 has a top surface 221 that is substantially coplanar to the top surface 211 of the first dielectric layer 210.

An integrated circuit (IC) chip or die 300 is disposed in the die cavity 213. The die 300 includes a front side 310 and a back side 320. In one embodiment, the back side 320 of the die 300 is secured or adhered to the bottom surface 222 of the layer of adhesive 220. In one embodiment, the front side 310 includes a plurality of die pads 341, 342.

A second dielectric layer 250 is formed onto the bottom surface of the first dielectric layer 210. The second dielectric layer 250 also encapsulates the die 300. In one embodiment, a plurality of die interconnects 271, 272 are formed in the second dielectric layer 250, where the die interconnects 271, 272 are electrically coupled to the die pads 341, 342 on the die 300.

In an embodiment of the present invention, a third dielectric layer 280 is formed onto the second dielectric layer 250. In one embodiment, a plurality of die interconnects 291, 292 are formed in the third dielectric layer 280. The die interconnects 291, 292 at the third dielectric layer 280 are electrically coupled to the die interconnects 271, 272 in the second dielectric layer 250.

In an embodiment of the present invention, a plurality of package pads 231, 232, 233, 234 are formed in the first dielectric layer 210. The package pads 231, 232, 233, 234 are formed at the periphery regions of the die 300. In one embodiment, each of the package pads 231, 232, 233, 234 comprises an exposed surface that is substantially coplanar with the top surface 211 of the first dielectric layer 210. Furthermore, a plurality of package interconnects 273, 274, 275, 276 are formed in the second dielectric layer 250, and are electrically coupled to the package pads 231, 232, 233, 234. In one embodiment, additional package interconnects 293, 294 are formed in the third dielectric layer 280, and are electrically coupled to the package interconnects 273, 276 in the second dielectric layer 250. In one embodiment, die interconnects 291, 292 are formed in the third dielectric layer, where the die interconnects 291, 292 are electrically coupled to the die interconnects 271, 272.

In one embodiment, a solder resist layer 400 is formed on the third dielectric layer 280. In one embodiment, the solder resist layer 400 comprises openings that expose the die interconnects 291, 292 as well as the package interconnects 293, 294. Solder balls or bumps 411, 412, 413, 414 are formed onto the die interconnects 291, 292 and the packaged interconnects 293, 294. The solder bumps 411, 412 are electrically coupled to the die interconnects 291, 292. The solder bumps 413, 414 are electrically coupled to the package interconnects 293, 294. FIG. 1 illustrates the formation of solder bumps 411, 412, 413, 414 on the semiconductor package 201 to create a Ball Grid Array (BGA) layout. Routing or traces for the BGA layout can be formed on the solder resist layer 400. It can be appreciated that other types of layout, for example a Land Grid Array (LGA), can be formed on the semiconductor package 201.

In one embodiment, the dielectric layers 210, 250, 280 with die interconnects 271, 272, 291, 292 and package interconnects 273-276, 293, 294 constitute a coreless substrate, where the die 300 is entirely embedded in the coreless substrate. By embedding the die 300 in the coreless substrate of the semiconductor package 201, the assembly steps commonly used in conventional flip-chip assembly are eliminated, thus reducing assembly costs. In addition, the semiconductor package 201 is no longer confined to strip manufacturing capability, which enables full panel processing, further reducing manufacturing costs. Furthermore, the semiconductor package 201 enables mixed-technology die stacking or package stacking Hence, the semiconductor package 201 provides the advantages of low-profile packaging, thin die assembly, POP compatibility, mixed-technology (e.g. wire-bond) die stacking at reduced package assembly costs.

Figure 2:
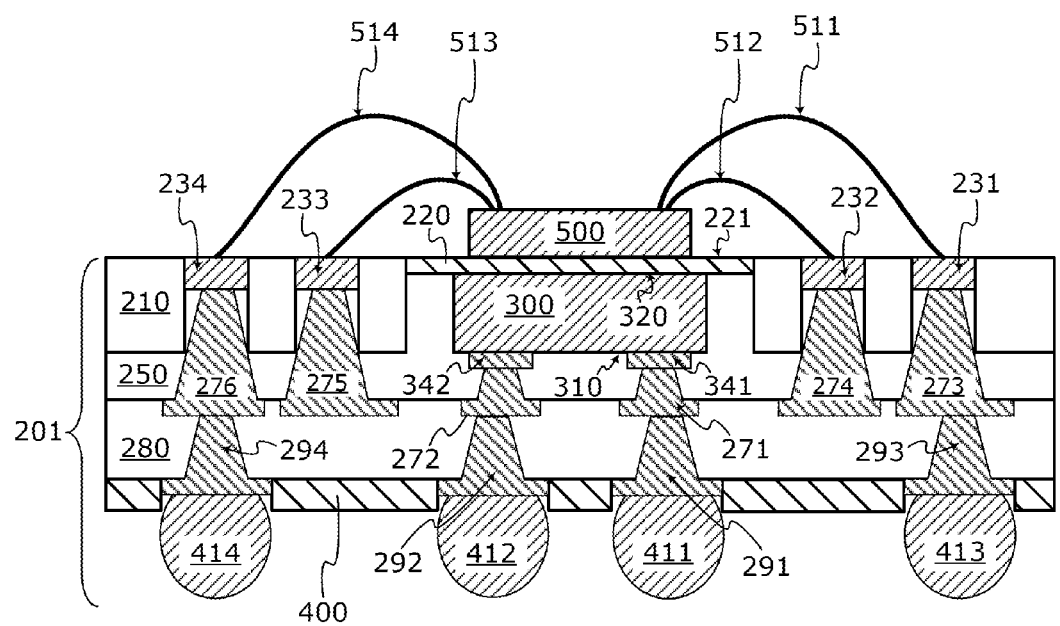
FIG. 2 is cross-sectional view that illustrates a semiconductor package in accordance with another embodiment of the present invention.

FIG. 2 illustrates an example of die stacking on the semiconductor package 201. In one embodiment, another die 500 is attached on the semiconductor package 201. The die 500 is secured or adhered to the top surface 221 of the layer of adhesive 220. A plurality of wire-bonding interconnects 511, 512, 513, 514 electrically couple the die 500 to the package pads 231, 232, 233, 234 of the semiconductor package 201. A layer of mold compound (not shown) can be used to protect the top die and encapsulate the wirebonds. In an embodiment of the present invention, the final package shown in FIG. 2 can be attached to a printed circuit board (PCB), where the package pads 231, 232, 233, 234 and the package interconnects 273, 274, 275, 276, 293, 294 serve as electrical connections between the die 500 and the traces on the PCB.

In an embodiment of the present invention, the semiconductor package 201 with additional die 500 forms a System-in-Package (SIP) that can be used in a variety of applications, for example portable or handheld devices such as laptops or mobile phones. In a specific embodiment, the die 300 is a System-on-Chip (SOC) containing a processor module while the die 500 is a memory module for the SOC.

Figure 3:
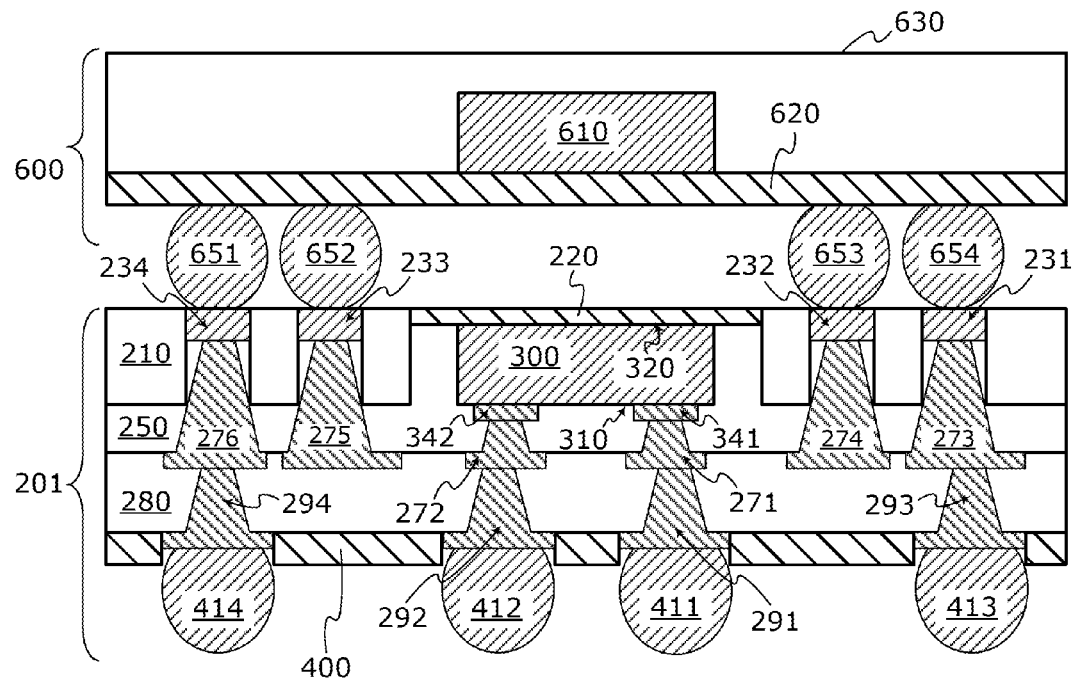
FIG. 3 is cross-sectional view that illustrates a semiconductor package in accordance with another embodiment of the present invention.

FIG. 3 illustrates an example of package stacking on the semiconductor package 201. In an embodiment of the present invention, another package 600 can be attached to the semiconductor package 201 to form a Package-on-Package (POP) structure. In one embodiment, the package 600 comprises a die 610 electrically coupled to a package substrate 620. A mold cap encapsulates the die 610 and serves a protection cover for the die 610. In one embodiment, a plurality of interconnects, for example solder bumps 651, 652, 653, 654, can be used to electrically couple the die 610 to the package pads 231, 232, 233, 234 of the semiconductor package 201.

In one embodiment, the POP structure shown in FIG. 3 is a System-in-Package. In a specific embodiment, the die 300 can be an SoC containing a processor module while the die 610 can be an additional logic chip for the SOC. In one embodiment, the package 600 is a flip-chip package.

Figure 4:
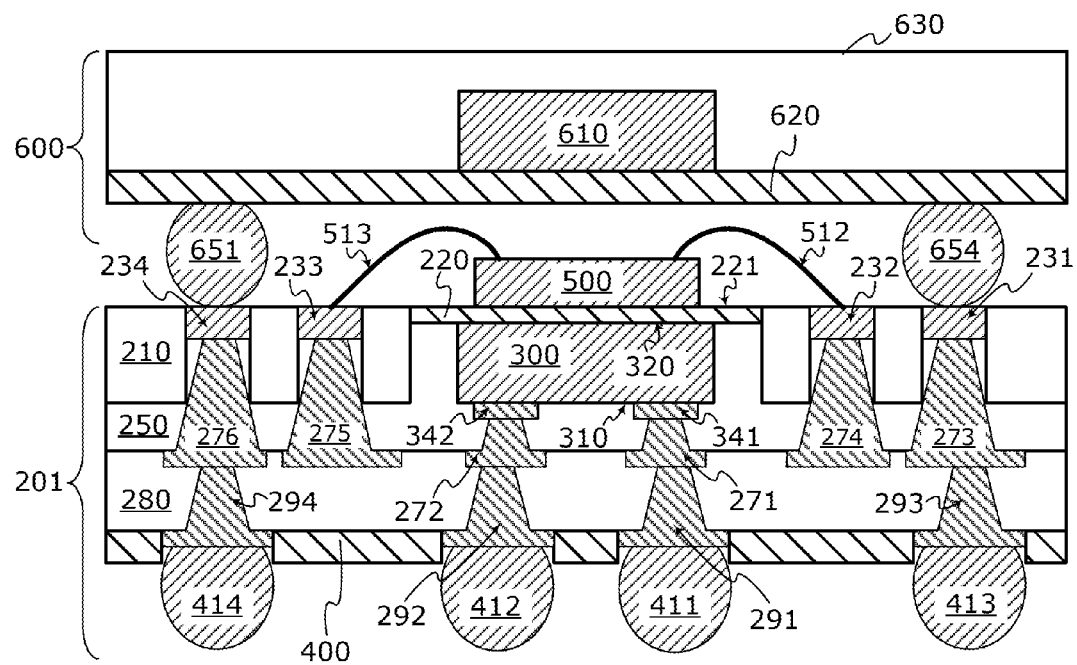
FIG. 4 is cross-sectional view that illustrates a semiconductor package in accordance with another embodiment of the present invention.

In an embodiment of the present invention, the semiconductor package 201 can be used with a combination of die stacking and package stacking technologies. In one embodiment, the die 500 is attached to the top surface 221 of the layer of adhesive 220 as shown in FIG. 4. Wire-bonding interconnects 512, 513 electrically couple the die 500 to the package pads 232, 233. The package 600 is stacked over the die 500 and the semiconductor package 201. The solder bumps 651, 654 electrically couple the package 600 to the package pad 231, 234.

Figure 5:
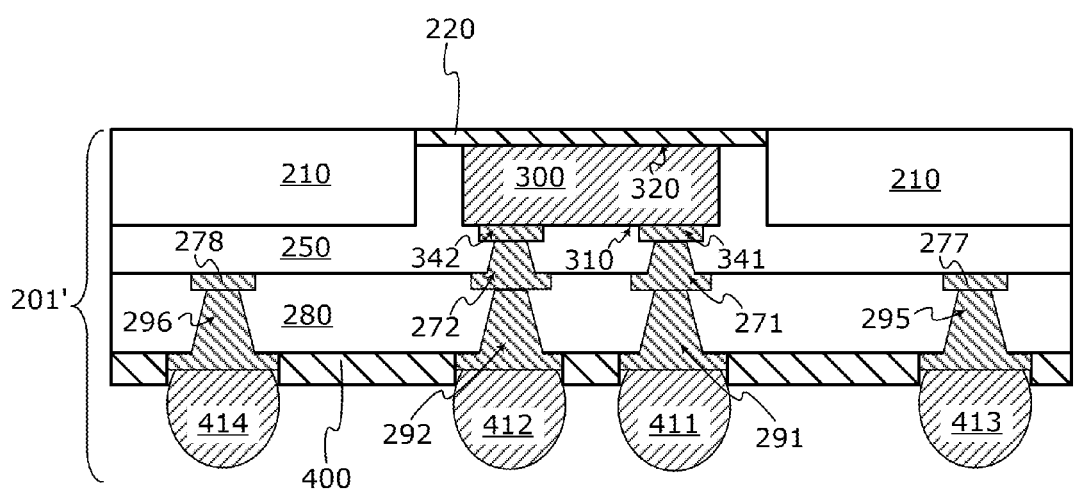
FIG. 5 is cross-sectional view that illustrates a semiconductor package in accordance with another embodiment of the present invention.

In an alternative embodiment, the die 300 is fully embedded in a semiconductor package without the package pads 231, 232, 233, 234 and the package interconnects 273, 274, 275, 276, 293, 294. For example, FIG. 5 illustrates an alternative semiconductor package 201' comprising die interconnects 271, 272, 291, 292, 295, 296. Solder bumps 411, 412, 413, 414 are formed on the die interconnects 291, 292, 295, 296.

Figure 6A:
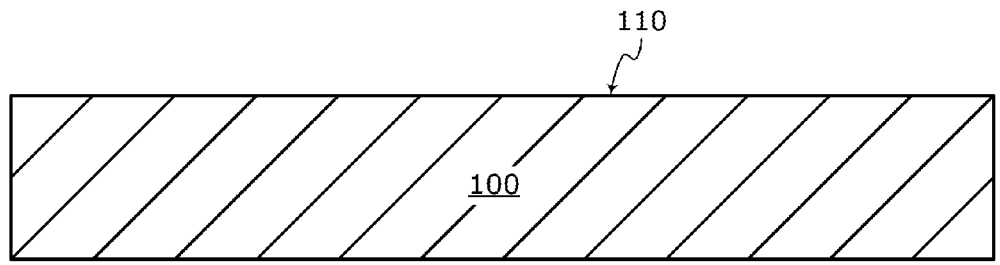
FIGS. 6A-6O are cross-sectional views that illustrate a method of fabricating the semiconductor package shown in FIG. 1.

FIGS. 6A-6L illustrate a method of forming the semiconductor package 201 shown in FIG. 1. The fabrication of the semiconductor package 201 begins by providing a panel or carrier 100 as shown in FIG. 6A. In one embodiment, the carrier 100 comprises a conductive surface 110 that enables plating thereon. In a specific embodiment, the carrier 100 is made of a conductive material such as copper, and the conductive surface 110 is a copper surface. In one embodiment, the carrier 100 has a thickness of around 50 um.

Figure 6B:
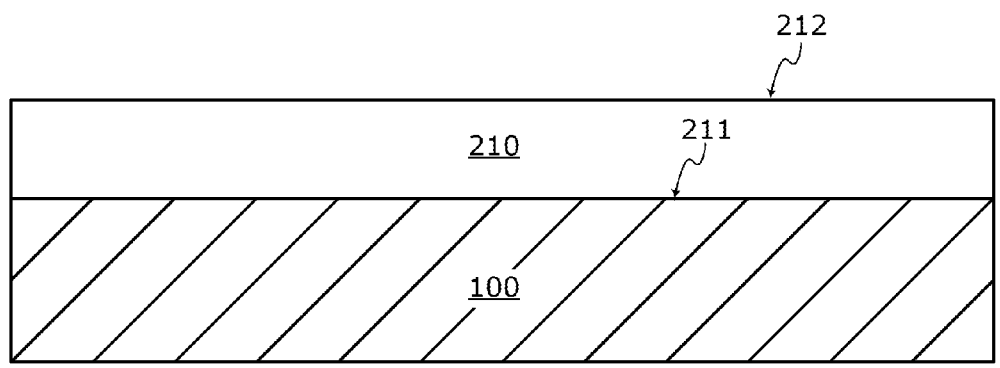
Figure 6C:
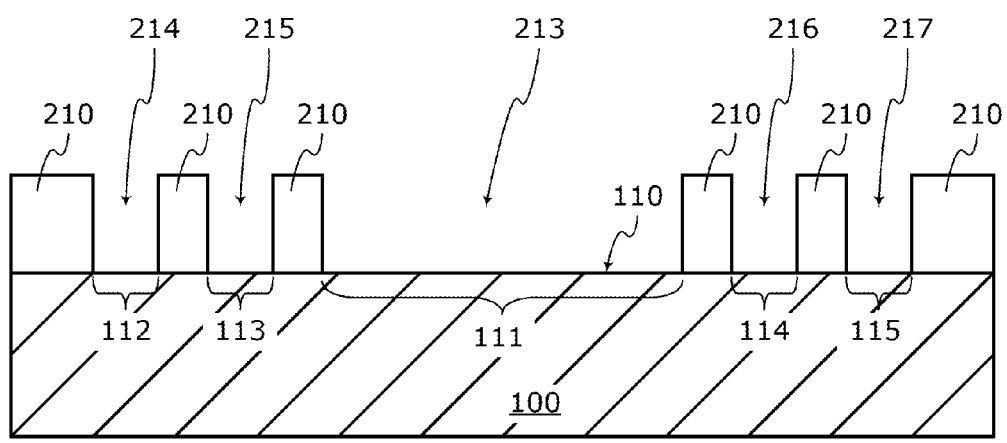

Next, the first dielectric layer 210 is formed on the conductive surface 110 of the carrier 100 as shown in FIG. 6B. In one embodiment, the first dielectric layer 210 comprises a top surface 211 and bottom surface 212, where the top surface 211 is formed on the conductive surface 110. In one embodiment, the first dielectric layer 210 has about the same thickness as the die that is subsequently embedded into the first dielectric layer 210. For example, the first dielectric layer has a thickness of around 50-150 um. Then, the die cavity 213 and a plurality of pad openings 214, 215, 216, 217 are formed in the first dielectric layer 210 as shown in FIG. 6C. In one embodiment, the die cavity 213 is centrally located and extends through the first dielectric layer 210 to expose a die region 111 on the conductive surface 110. The plurality of pad openings 214, 215, 216, 217 expose a plurality of pad regions 112, 113, 114, 115 on the conductive surface 110.

In an embodiment of the present invention, the first dielectric layer 210 is made of a photo-imageable or photo-definable material. In one embodiment, the first dielectric layer 210 is made of a positive photo-definable material, where portions of the first dielectric layer 210 exposed to the radiation source are removed upon developing the first dielectric layer 210. In another embodiment, the first dielectric layer 210 is made of a negative photo-definable material, where portions of the first dielectric layer 210 exposed to the radiation source are retained upon developing the first dielectric layer 210. The photo-definable material includes but is not limited to epoxy-based photoresists. In an embodiment of the present invention, the fabrication of the (photo-definable) first dielectric layer 210 begins by laminating a layer of photo-definable material onto the conductive surface 110 (as shown in FIG. 6B). Then, the photo-definable material is exposed to a radiation source and subsequently developed to define the die cavity 211 and the plurality of pad openings 212, 213, 214, 215 (as shown in FIG. 6C).

In an alternative embodiment, the first dielectric layer 210 is made of common dielectric materials that are not photo-definable. In this case, the first dielectric layer 210 is fabricated by depositing the first dielectric layer 210 onto the conductive surface 110 (as shown in FIG. 6B), followed by defining the die cavity 211 and the pad openings 212, 213, 214, 215 in the first dielectric layer 210 (as shown in FIG. 6C). In one embodiment, the die cavity 211 and the pad openings 212, 213, 214, 215 are defined or created by common photolithography and etching processes, such as but not limited to a plasma etch process. In another embodiment, the die cavity 211 and the pad openings 212, 213, 214, 215 are defined by using laser or mechanical drilling processes commonly used in semiconductor manufacturing.

Figure 6D:
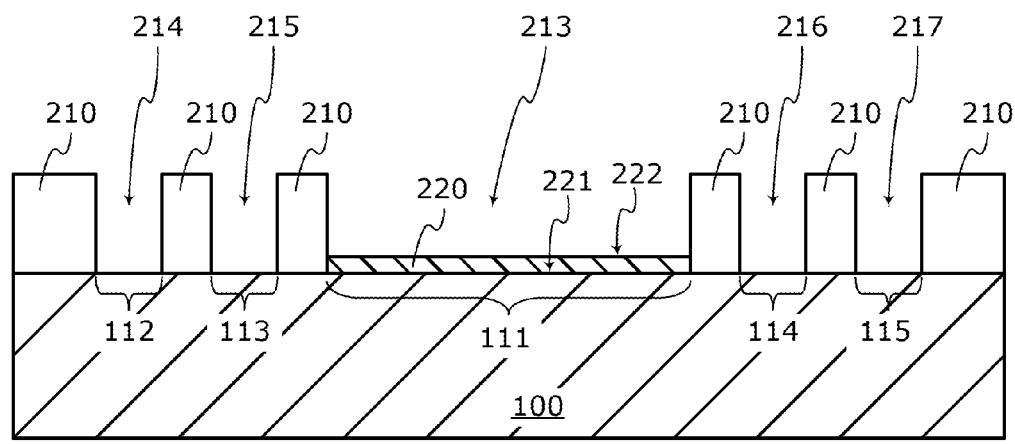

Next, the layer of adhesive 220 is formed on the die region 111 of the conductive surface 110 as shown in FIG. 6D. The layer of adhesive 220 comprises a top surface 221 and a bottom surface 222. In one embodiment, the top surface 221 is formed onto the die region 111 so that it is substantially coplanar to the top surface 211 of the first dielectric layer 210. In one embodiment, the layer of adhesive 220 is sprayed onto the die region 111. In another embodiment, the layer of adhesive 220 is formed by using a well known screen printing techniques. For example, an adhesive material is printed onto the die region 111 using a mesh mask (not shown), and then the adhesive material is cured to form the layer of adhesive 220 covering the entire die region 111. In one embodiment, the layer of adhesive 220 is selectively formed on the die region 111 only. In other words, the layer of adhesive 220 is not formed onto the pad regions 112, 113, 114, 115.

In one embodiment, the layer of adhesive 220 is formed with a thickness of around 10 to 50 um. The layer of adhesive 220 is made from materials, such as but not limited to filled epoxy-based materials. In an embodiment of the present invention, the layer of adhesive 220 remains as a permanent feature of the semiconductor package 201 to protect a die subsequently embedded in the first dielectric layer 210. Furthermore, the layer of adhesive 220 can be used as a surface for subsequent marking or used to minimize any warpage that may occur within the die.

Figure 6E:
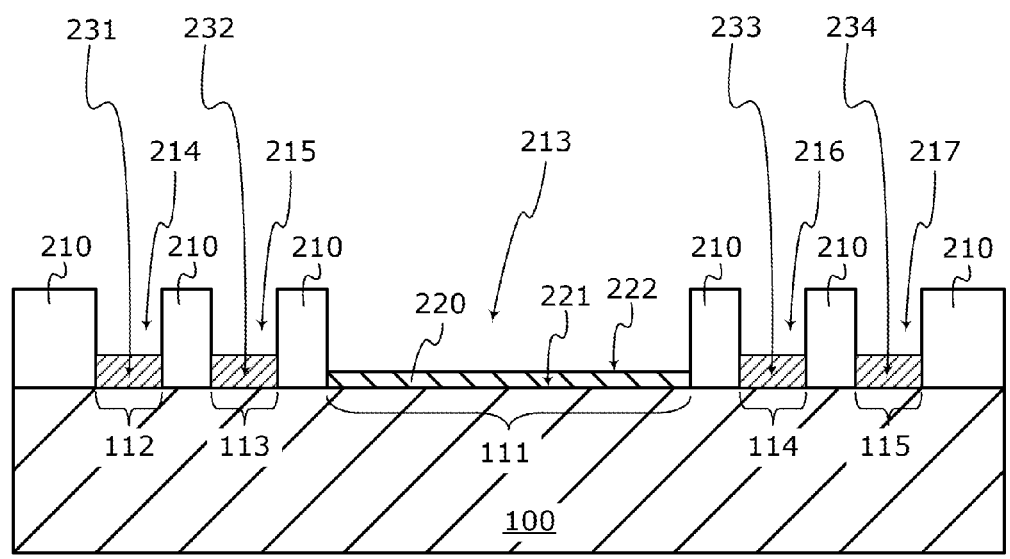

Next, the plurality of package pads 231, 232, 233, 234 are formed on the pad regions 112, 113, 114, 115 of the conductive surface 110 as shown in FIG. 6E. In an embodiment of the present invention, the plurality of package pads 231, 232, 233, 234 are formed by using well known electrolytic plating techniques. In one embodiment, electroplating of the pad regions 112, 113, 114, 115 begins by forming a resist layer (not shown) on the first dielectric layer 210, where the resist layer is patterned to exposed the pad regions 112, 113, 114, 115. Then, the pad regions 112, 113, 114, 115 are electroplated using metals such as but not limited to gold (Au), palladium (Pd), nickel (Ni) and copper (Cu). In a specific embodiment, the pad regions 112, 113, 114, 115 are electroplated in the following order: gold, followed by palladium, followed by nickel. In this case, the plurality of package pads 231, 232, 233, 234 comprises a composition or multi-layered stack of gold, palladium and nickel. After the electroplating process is complete, the resist layer is removed from the first dielectric layer 210.

Figure 6F:
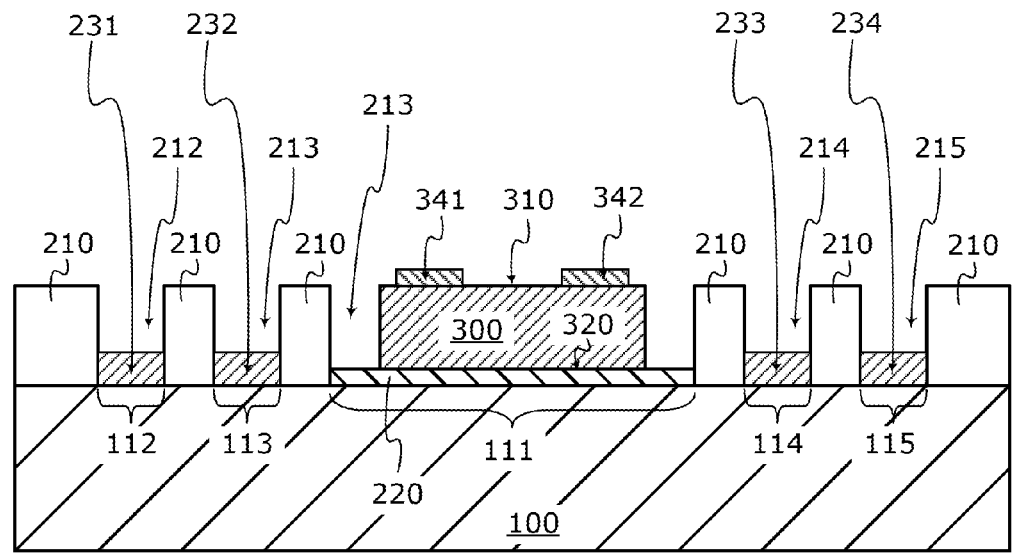

Next, the die 300 is attached to the layer of adhesive 220 as shown in FIG. 6F. The die 300 comprises a front side 310 and a back side 320. In one embodiment, the front side 310 of the die 300 includes the plurality of die pads 341, 342. In one embodiment, well known die placement techniques can be used to insert the die 300 into the die cavity 211. The die 300 is then secured or adhered to the layer of adhesive 220. In one embodiment, the back side 320 of the die 240 is adhered to the layer of adhesive 220.

FIGS. 6D and 6F describe forming the layer of adhesive 220 onto the carrier 100 prior to attaching the die 300 onto the layer of adhesive 220. In an alternative embodiment, an adhesive film is attached to the die back side 320 first before placing the die 300 with adhesive film onto the carrier 100. For example, beginning from FIG. 6C, a die 300 with adhesive film on its back side 320 is placed onto the die region 111 of the carrier so that the adhesive film secures the die 300 onto the carrier 100. In this case, the adhesive film is only formed beneath the die 300 and does not extend beyond the edges of the die 300. In other words, the adhesive film does not cover the entire die region 111.

The layer of adhesive 220 serves as a protection layer for the die backside 320. Furthermore, the layer of adhesive 220 can be used to minimize any warpage that may occur in the die 300. In one embodiment, the layer of adhesive 220 comprises a UV-curable property that can be subsequently activated to attach a wirebond die to the top surface 221 of the layer of adhesive 220. In one embodiment, the layer of adhesive 220 comprises thermal conductive properties that facilitate heat dissipation of the die 300.

Figure 6G:
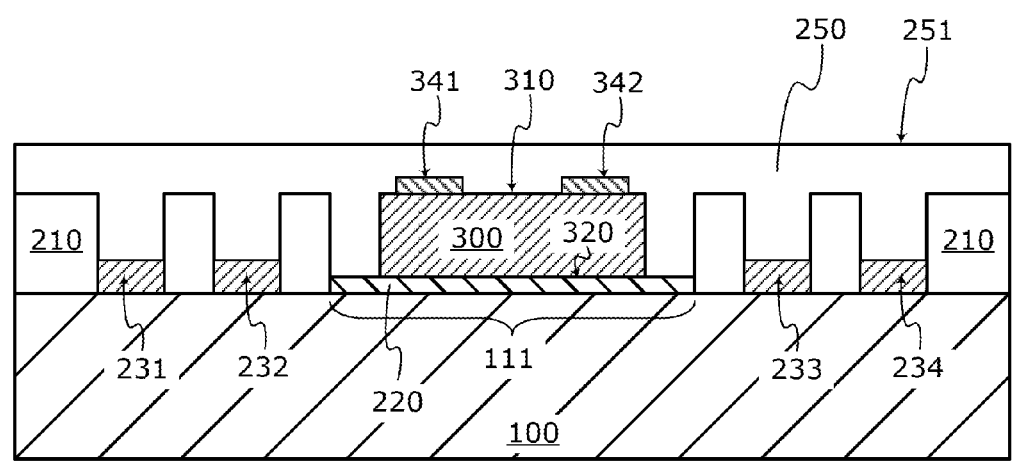
Figure 6H:
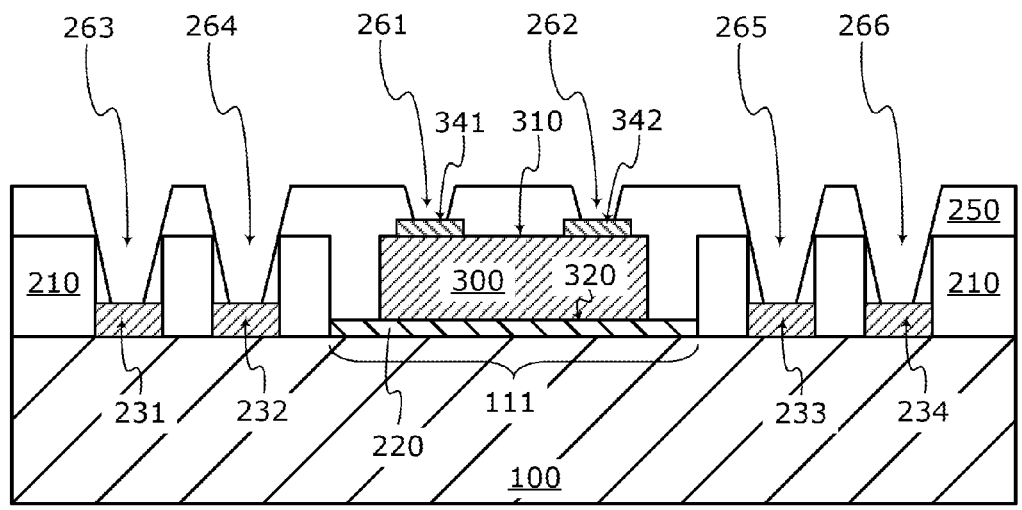
Figure 6I:
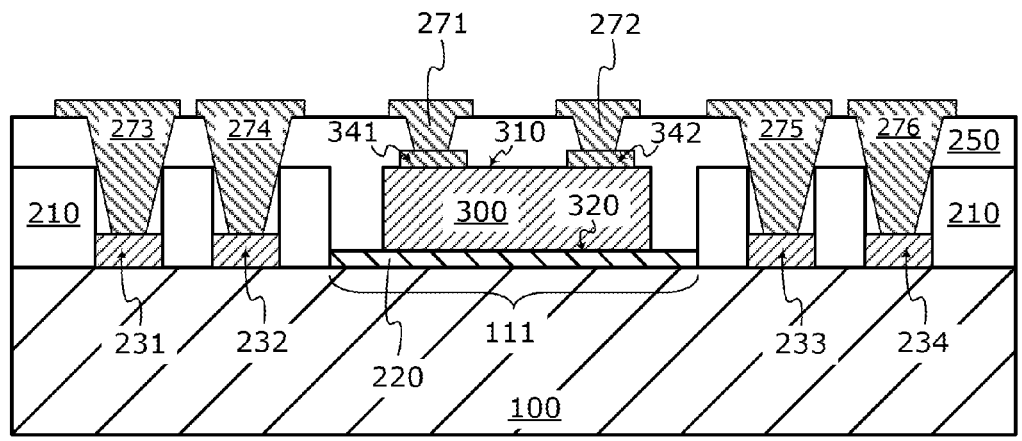

Next, a second dielectric layer 250 is formed onto the first dielectric layer 210 and the die 300 as shown in FIG. 6G. In an embodiment of the present invention, the second dielectric layer 250 is forming by well known lamination techniques. The second dielectric layer 250 can be made of materials such as but not limited to filled epoxy-based composite materials) In one embodiment, the second dielectric layer 250 is formed with a thickness of around 10-30 um.

In one embodiment, the second dielectric layer 250 encapsulates the entire die 300, including the front side 310 and sidewalls of the die 300. Furthermore, the second dielectric layer 250 is formed onto the plurality of package pads 231, 232, 233, 234. In one embodiment, the second dielectric layer 250 is formed with a level surface 251 to facilitate the subsequent build-up process.

Next, a plurality of interconnects are formed on the die pads 341, 342 and the package pads 231, 232, 233, 234. In an embodiment of the present invention, a semi-additive process (SAP) is used to form the plurality of interconnects. For example, the fabrication of the plurality of interconnects begins, in FIG. 6H, by forming via openings 261, 262, 263, 264, 265, 266 in the second dielectric layer 250. In one embodiment, the via openings 261, 262 expose the die pads 341, 342 at the front side 310 of the die 300, whereas the via opening 263, 264, 265, 266 expose the package pads 231, 232, 233, 234.

In one embodiment, the via openings 261, 262, 263, 264, 265, 266 are formed by a mechanical or laser drilling process. In one embodiment, the via openings 261, 262 and the via openings 263, 264, 265, 266 are defined in separate drilling processes due to the different diameter and depth. For example, the via openings 261, 262 are formed by using a UV YAG laser source. The via openings 261, 262 are formed with a diameter size of less than 50 um. Then, the via openings 263, 264, 265, 266 are formed with a $CO_2$ laser source. The via openings 263, 264, 265, 266 are formed with a diameter size of around 50-150 um. In an embodiment of the present invention, the surfaces of the via openings 261, 262, 263, 264, 265, 266 can be cleaned by using a desmear process based on permanganate chemistry that is commonly used in substrate manufacturing.

After forming the via openings 261, 262, 263, 264, 265, 266, a metal layer (not shown) is deposited into the via openings 261, 262, 263, 264, 265, 266, and onto the die pads 341, 342 and package pads 231, 232, 233, 234. In a specific embodiment, the metal layer starts from a copper seed layer deposited by electroless plating. Subsequently, the metal layer is patterned using well known photolithography, electrolytic copper plating, resist stripping, and etching techniques to form separate interconnects 271, 272, 273, 274, 275, 276 shown in FIG. 6I. In one embodiment, die interconnects 271, 272 are formed onto the die pads 341, 342, whereas package interconnects 273, 274, 275, 276 are formed onto the package pads 231, 232, 233, 234. The die interconnects 271, 272 and the package interconnects 273, 274, 275, 276 may be formed in separate processes.

The number of build-up layers in the semiconductor package can be increased by using the SAP build-up process. For example, repeating the steps of forming the dielectric layer, followed by forming the interconnects, thereby creating more metallization layers. For example, in FIG. 6J, a third dielectric layer 280 is formed over the second dielectric layer 250 and the interconnects 271, 272, 273, 274, 275, 276. Then, a plurality of interconnects 291, 292, 293, 294 are formed in the third dielectric layer 280. In one embodiment, the die interconnects 291, 292 are formed onto die interconnects 271, 272 such that the interconnects 291, 292 are electrically coupled to the die interconnect 271, 272. Package interconnects 293, 294 are formed over the interconnects 273, 276, where the package interconnects 293, 294 are electrically coupled to the interconnects 273, 276.

Figure 6J:
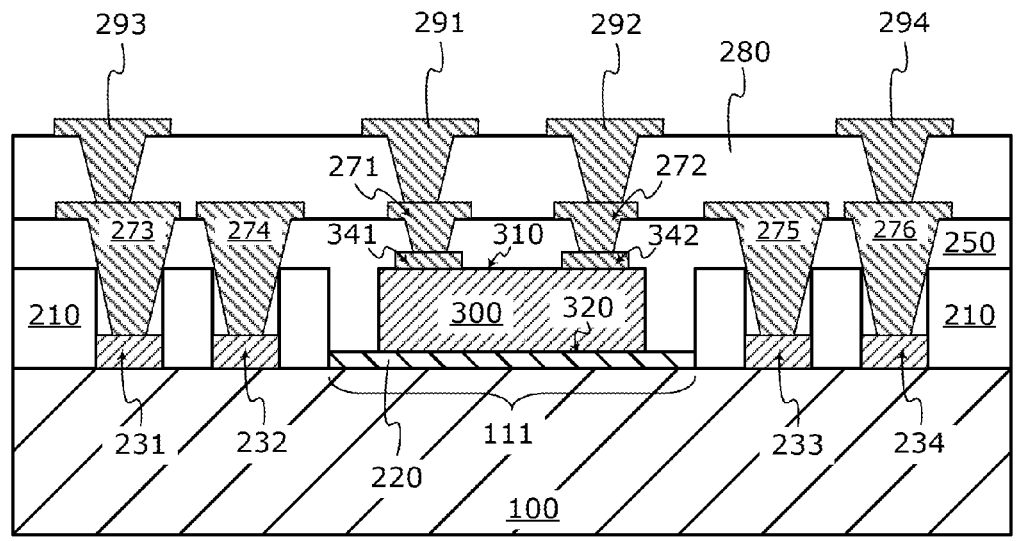

For illustrations purposes, FIG. 6J only shows two build-up layers (i.e. dielectric layers 250, 280). It can be appreciated that the number of dielectric layers or build-up layers can be increased according to the package design. In a typical design, around 3-6 build-up layers constitute the semiconductor package.

Figure 6K:
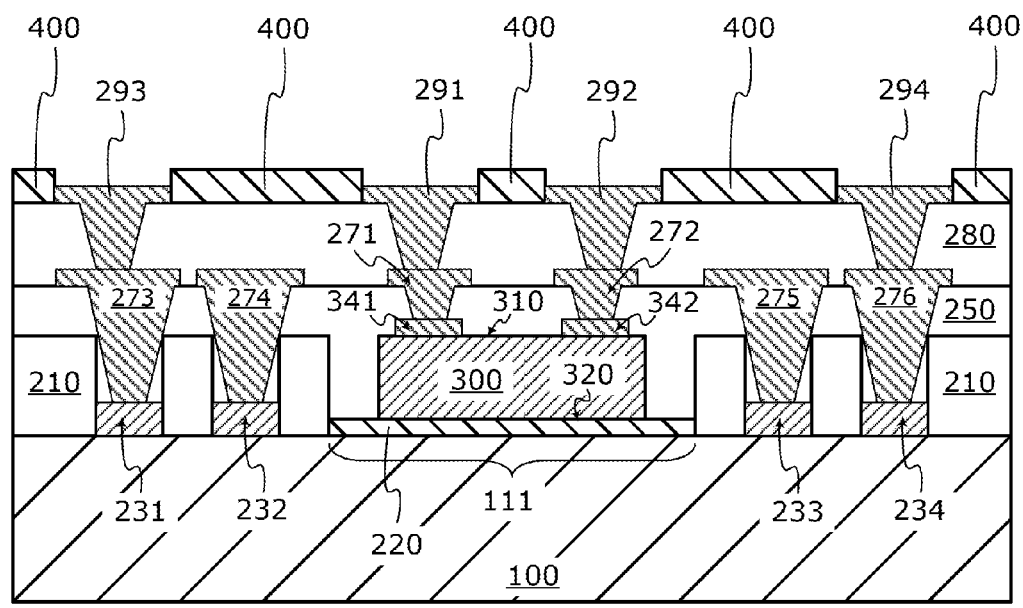

In an embodiment of the present invention, a solder resist layer 400 is formed over the uppermost dielectric layer (i.e. the third dielectric layer 280) as shown in FIG. 6K. In one embodiment, the solder resist layer 400 are formed with openings that exposes the die interconnects 291, 292 and package interconnects 293, 294. In one embodiment, the solder resist layer 400 can be screen-printed or laminated onto the third dielectric layer 280. Then, a laser process can be performed on the solder resist layer 400 to define the openings that exposes the die interconnects 291, 292 and package interconnects 293, 294. In another embodiment, the solder resist layer 400 is made of photo-definable polymer material that can be exposed to a radiation source and developed to form the openings.

Figure 6L:
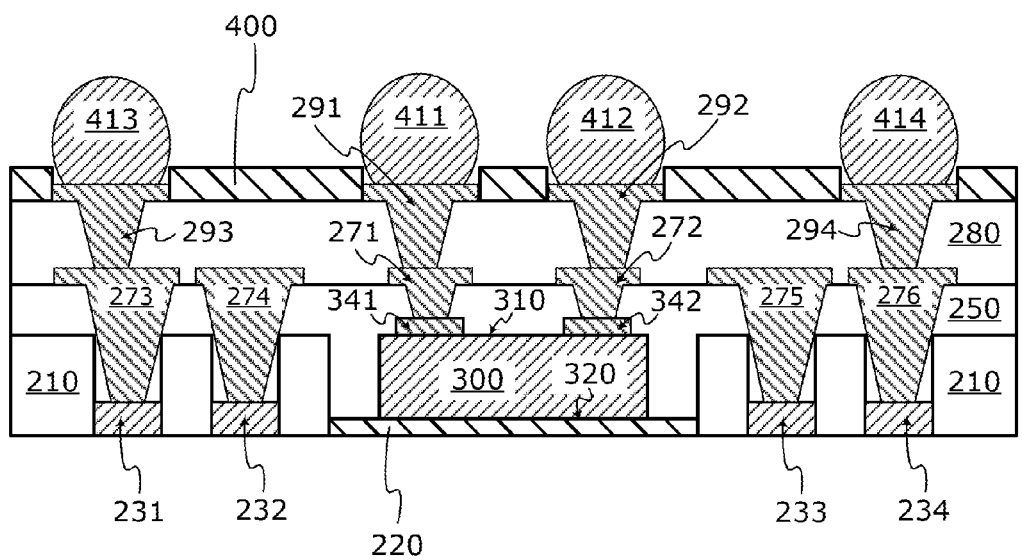

Next, the carrier 100 is removed from the semiconductor package 201 to expose the package pads 231, 232, 233, 234 and the adhesive layer 220 as shown in FIG. 6L. In one embodiment, the carrier 100 is removed by using well known etching processes. In one embodiment, the etching uses an etch chemistry that is substantially selective to the first dielectric layer 210, the layer of adhesive 220, and the package pads 231, 232, 233, 234. In other words, the etch chemistry removes the carrier 100 faster than it removes the first dielectric layer 210, the layer of adhesive 220, or the package pads 231, 232, 233, 234.

Figure 6M:
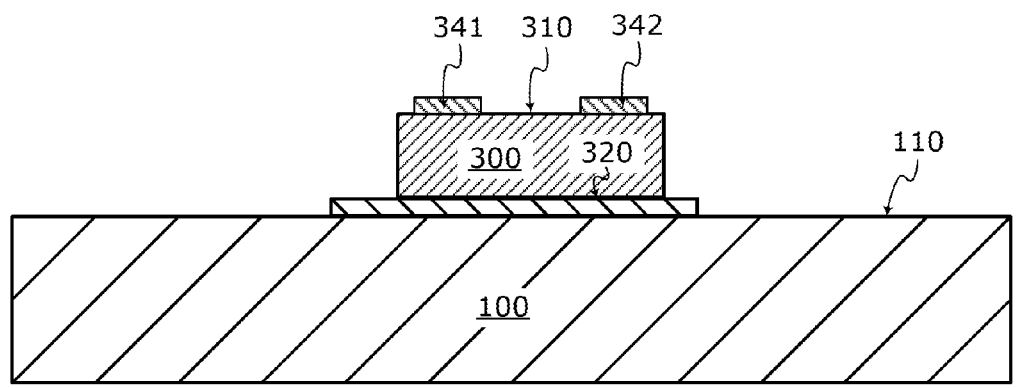

Then, the solder balls or bumps 411, 412 are formed onto the exposed interconnects 292, 293. The solder bumps 411, 412 are made from well known solder materials and are formed by well known techniques, such as but not limited to evaporation, electroplating or direct placement. This completes the fabrication of the semiconductor device shown in FIG. 1. FIGS. 6A-6K shows the fabrication of the semiconductor package 201 on one side of the carrier 100. It can be appreciated that both sides of the carrier 100 can be used to form two semiconductor packages at the same time. In another embodiment, the die 300 may be first attached to the carrier 100 (FIG. 6m). A layer 211 may be formed on the die (FIG. 6n), by a lamination process, for example. The single layer 211 may be used instead of the two layers 210 and 250 of FIG. 6I, for example, to form the structure in FIG. 6o, according to the methods described previously herein.

Figure 7A:
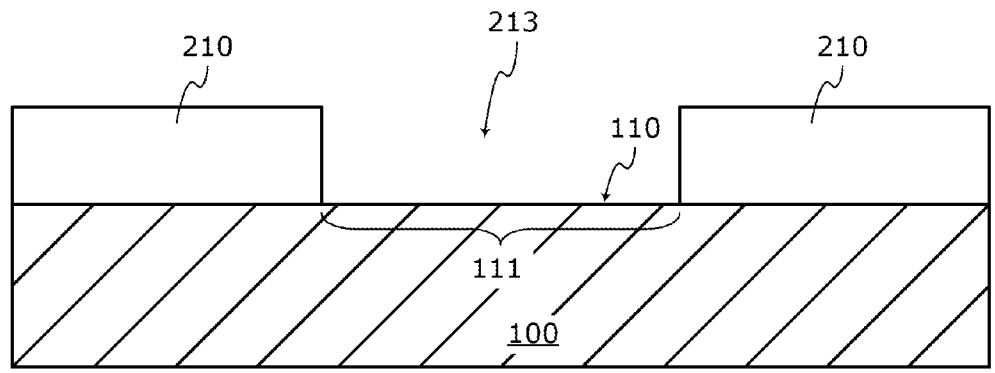
FIGS. 7A-7E are cross-sectional views that illustrate a method of fabricating the semiconductor device shown in FIG. 5.
Figure 7B:
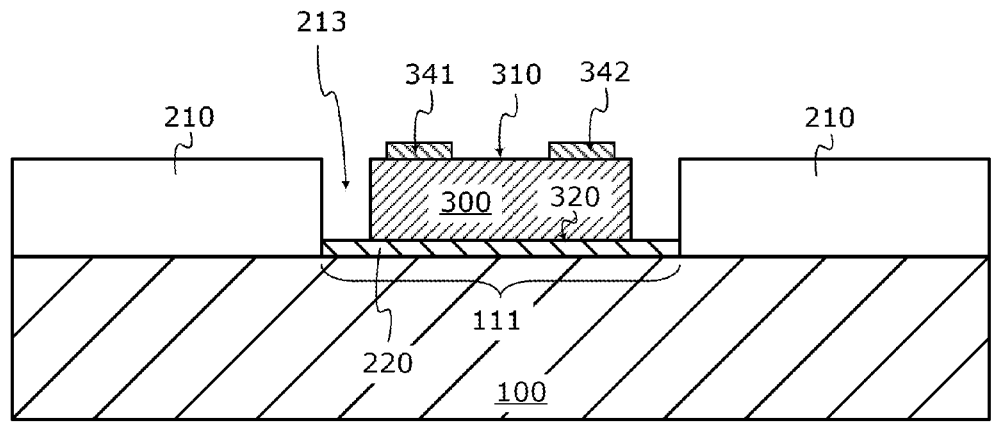

FIGS. 7A-7E illustrate a method of forming the semiconductor package 201' shown in FIG. 5. The fabrication of the semiconductor package 201' is similar to the process described in FIGS. 6A-6L except that the package interconnects are not formed in the semiconductor package 201'. Continuing from FIG. 6B, only the die cavity 213 is formed in the first dielectric layer 210 as shown in FIG. 7A. Next, the layer of adhesive 220 and the die 300 are attached over the die region 111 of the carrier 100 as shown in FIG. 7B. The methods of forming the layer of adhesive 220 and attaching the die 300 are similar to FIGS. 6D and 6F, and thus will not be described here.

Figure 7C:
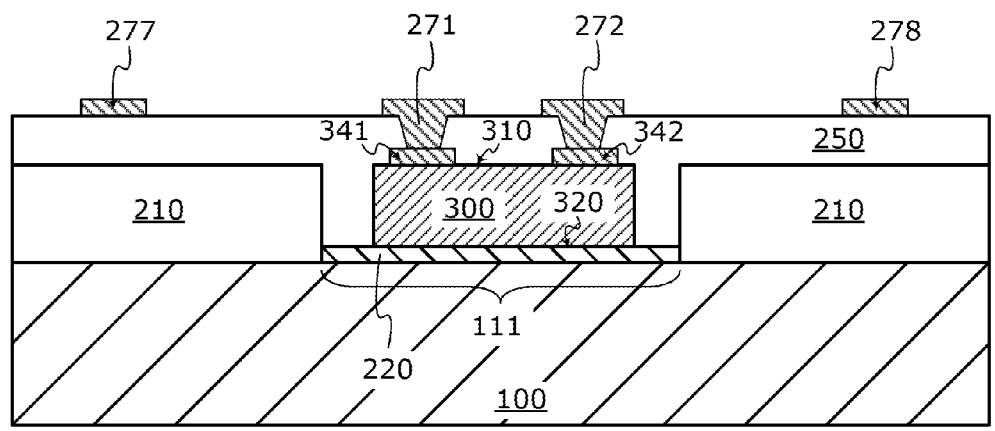
Figure 7D:
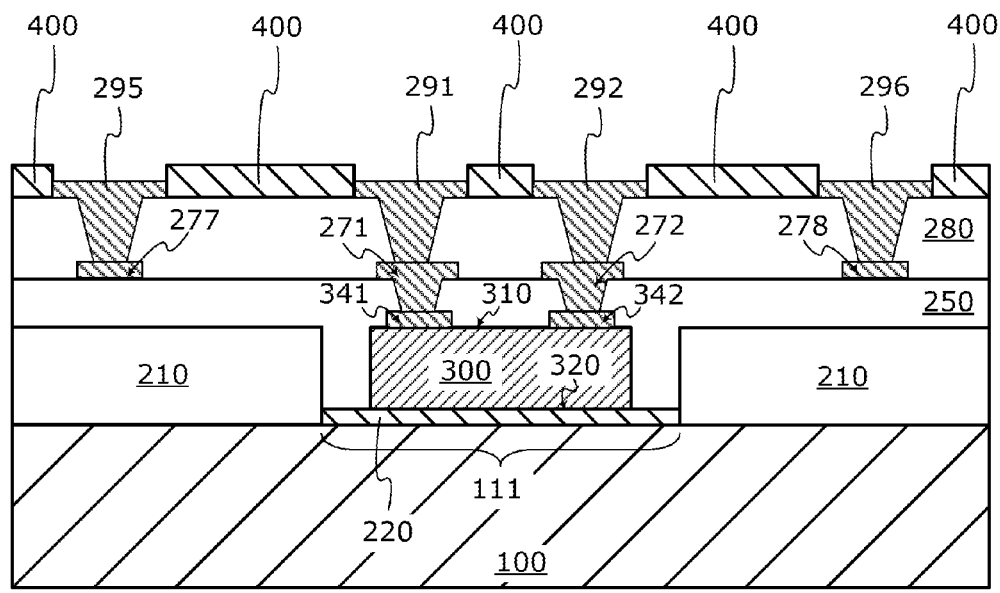

Next, in FIG. 7C, the second dielectric layer 250 is formed over the first dielectric layer 210 and the die 300, followed by forming the die interconnects 271, 272 on the die pads 341, 342. The methods of forming the second dielectric layer 250 and the die interconnects 271, 272 are similar to the process described in FIGS. 6G, 6H and 6I. In one embodiment, metal lines 277, 278 are formed during the fabrication of the die interconnects 271, 272. Then, the third dielectric layer 280 is formed onto the second dielectric layer 290 as shown in FIG. 7D. Die interconnects 291, 292, 295, 296 are formed in the third dielectric layer 280. In this case, the additional die interconnects 295, 296 are formed onto the metal lines 277, 278. The solder resist layer 400 is formed over the third dielectric layer 280 and exposes the die interconnects 291, 292, 295, 296.

Figure 6N:
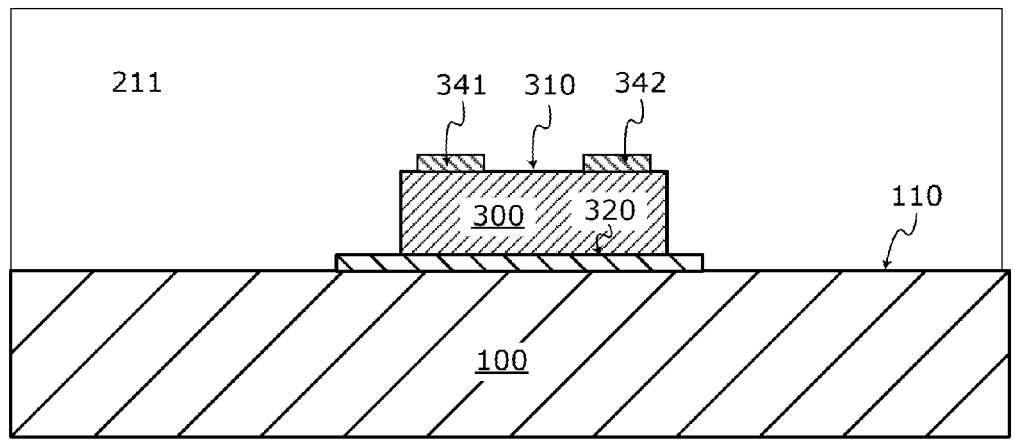
Figure 6O:
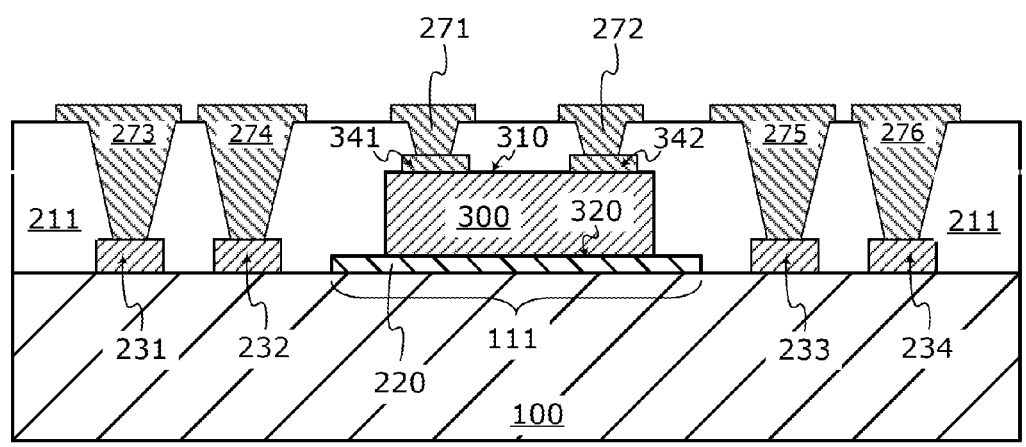
Figure 7E:
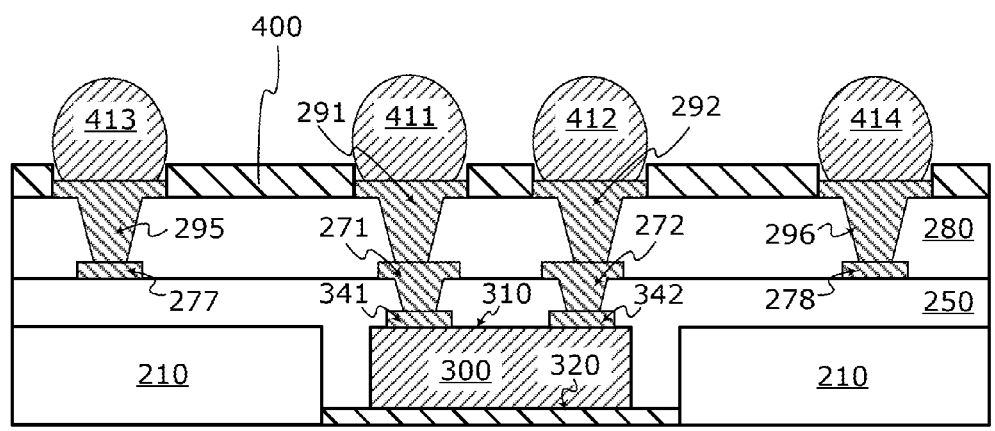

Next, in FIG. 7E, the carrier 100 is removed from the semiconductor package 201 using similar methods described in FIG. 6K. Then the solder bumps 411, 412, 413, 414 are formed onto the die interconnects 291, 292, 295, 296. This completes the fabrication of the semiconductor package 201' as shown in FIG. 5. In another embodiment, the die 300 may be first attached to the carrier 100, and a single layer that may substitute for the layers 210 and 250 (similar to the layer 211 of FIG. 6n) may be formed on the die 300 by a lamination process, for example, in a similar manner as depicted in FIGS. 6m-6o.

Figure 8:
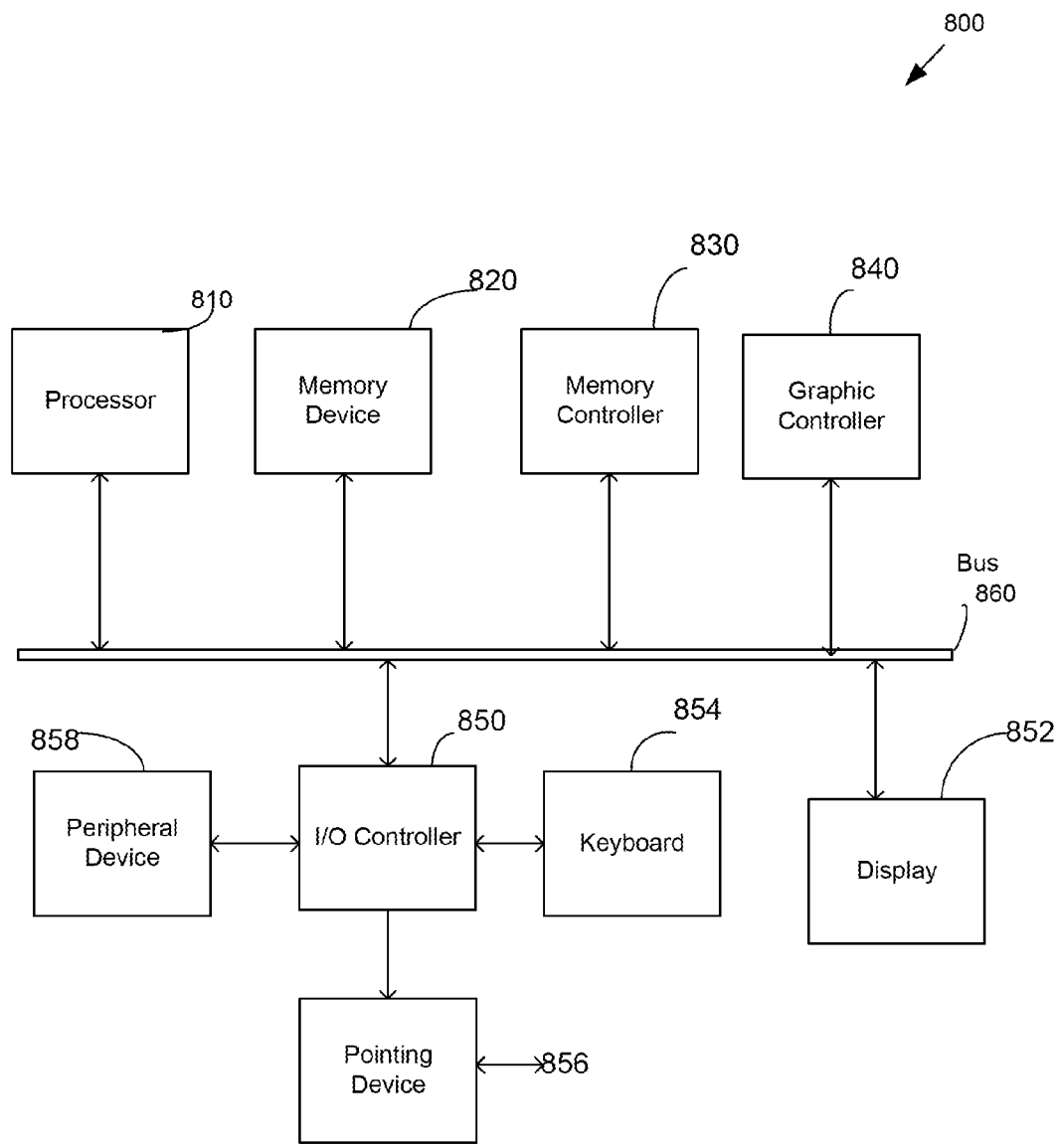
FIG. 8 is a system in accordance with embodiments of the present invention.

FIG. 8 shows a computer system according to an embodiment of the invention. System 800 includes a processor 810, a memory device 820, a memory controller 830, a graphics controller 840, an input and output (I/O) controller 850, a display 852, a keyboard 854, a pointing device 856, and a peripheral device 858, all of which may be communicatively coupled to each other through a bus 860, in some embodiments. Processor 810 may be a general purpose processor or an application specific integrated circuit (ASIC). I/O controller 850 may include a communication module for wired or wireless communication. Memory device 820 may be a dynamic random access memory (DRAM) device, a static random access memory (SRAM) device, a flash memory device, or a combination of these memory devices. Thus, in some embodiments, memory device 820 in system 800 does not have to include a DRAM device.

One or more of the components shown in system 800 may be included in/and or may include one or more integrated circuit packages, such as the package structure of FIG. 7e for example. For example, processor 810, or memory device 820, or at least a portion of I/O controller 850, or a combination of these components may be included in an integrated circuit package that includes at least one embodiment of a structure described in the various embodiments.

These elements perform their conventional functions well known in the art. In particular, memory device 820 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 810. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 820 may supply the processor 810 with the executable instructions for execution.

System 800 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A method of forming a semiconductor package comprising:
    providing a carrier having a conductive surface;
    forming a first dielectric layer on the conductive surface of the carrier;
    forming a die cavity extending through the first dielectric layer to expose a die region on the conductive surface;
    depositing an adhesive into the die cavity to form a layer of adhesive covering the die region of the conductive surface;
    inserting a die into the die cavity to attach the die onto the layer of adhesive, the die having a back side secured to the layer of adhesive, a front side having a plurality of die pads, and at least one sidewall extending between the die front side and the die back side;
    depositing a second dielectric layer onto the first dielectric layer and the die, wherein a portion of the second dielectric layer contacts the die front side, and wherein a portion of the second dielectric layer extends into the die cavity and contacts the at least one die sidewall;
    forming a plurality of die interconnects on the plurality of die pads at the front side of the die; and
    removing the carrier to expose the layer of adhesive.

2. The method of claim 1, wherein forming the first dielectric layer further comprises:
    forming a plurality of pad openings in the first dielectric layer, the plurality of pad openings exposing a plurality of pad regions on the conductive surface;
    forming a plurality of package pads on the plurality of pad regions of the conductive surface; and
    forming a plurality of package interconnects on the plurality of package pads.

3. The method of claim 2, wherein the first dielectric layer is a photo-definable dielectric material.

4. The method of claim 3, wherein the first dielectric layer is formed by:
    laminating the photo-definable dielectric material onto the conductive surface; and
    exposing the first dielectric layer to a radiation source and developing the first dielectric layer to define the die cavity and the plurality of pad openings in the first dielectric layer.

5. The method of claim 2, wherein forming the first dielectric layer comprises:
    depositing the first dielectric layer on the conductive surface; and
    defining the die cavity and the plurality of pad openings in the first dielectric layer.

6. The method of claim 5, wherein the die cavity and the plurality of pad openings are defined by an etching process.

7. The method of claim 5, wherein the die cavity and the plurality of pad openings are defined by a laser or mechanical drilling process.

8. The method of claim 2, wherein the plurality of package pads are formed by electrolytically plating the plurality of pad regions.

9. The method of claim 1, wherein the layer of adhesive is sprayed or screen printed onto the die region.

10. The method of claim 1, wherein forming the plurality of die interconnects comprises:
    forming a plurality of via openings in the second dielectric layer, the plurality of via openings exposing the plurality of die pads at the front side of the die;
    forming a metal layer into the plurality of via openings and onto the plurality of die pads; and
    etching the metal layer to form the plurality of die interconnects.

11. The method of claim 2, wherein forming the plurality of package interconnects comprises:
    forming a plurality of via openings in the second dielectric layer, the plurality of via openings in the second dielectric layer exposing the plurality of package pads;
    forming a metal layer into the second plurality of via openings and onto the plurality of package pads; and
    etching the metal layer to form the plurality of package interconnects.

12. The method of claim 2, further comprising:
    depositing a third dielectric layer onto the second dielectric layer; and
    forming a plurality of interconnects on the plurality of die interconnects or on the plurality of package interconnects.

13. The method of claim 2, further comprising:
    forming a solder resist layer over the second dielectric layer; and
    forming a plurality of solder bumps, wherein the plurality of solder bumps are electrically coupled to the plurality of die interconnects or to the plurality of package interconnects.

* * * * *